(12) United States Patent
Tajalli

(10) Patent No.: US 11,362,800 B2
(45) Date of Patent: Jun. 14, 2022

(54) DYNAMICALLY WEIGHTED EXCLUSIVE OR GATE HAVING WEIGHTED OUTPUT SEGMENTS FOR PHASE DETECTION AND PHASE INTERPOLATION

(71) Applicant: Kandou Labs SA, Lausanne (CH)

(72) Inventor: Armin Tajalli, Salt Lake City, UT (US)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 16/781,910

(22) Filed: Feb. 4, 2020

(65) Prior Publication Data

US 2020/0177363 A1 Jun. 4, 2020

Related U.S. Application Data

(63) Continuation of application No. 15/881,509, filed on Jan. 26, 2018, now Pat. No. 10,554,380.

(51) Int. Cl.
*H04L 7/033* (2006.01)
*H03K 19/21* (2006.01)
(Continued)

(52) U.S. Cl.
CPC ......... *H04L 7/0331* (2013.01); *H03K 19/215* (2013.01); *H03L 7/085* (2013.01);
(Continued)

(58) Field of Classification Search
CPC ..... H04L 7/0331; H04L 7/0807; H04L 7/085; H04L 7/099; H04L 7/0087; H03K 19/215
(Continued)

(56) References Cited

U.S. PATENT DOCUMENTS

| 4,839,907 A | 6/1989 | Saneski |
| 5,266,907 A | 11/1993 | Dacus |

(Continued)

FOREIGN PATENT DOCUMENTS

| CN | 203675093 U | 6/2014 |
| EP | 0740423 A2 | 10/1996 |

OTHER PUBLICATIONS

International Search Report and Written Opinion for PCT/US2019/015261, dated Apr. 19, 2019, 1-10 (10 pages).

(Continued)

*Primary Examiner* — Kevin M Burd
(74) *Attorney, Agent, or Firm* — Invention Mine LLC

(57) ABSTRACT

Methods and systems are described for receiving a reference clock signal and a phase of a local oscillator signal at a dynamically-weighted XOR gate comprising a plurality of logic branches, generating a plurality of weighted segments of a phase-error signal, the plurality of weighted segments including positive weighted segments and negative weighted segments, each weighted segment of the phase-error signal having a respective weight applied by a corresponding logic branch of the plurality of logic branches, generating an aggregate control signal based on an aggregation of the weighted segments of the phase-error signal, and outputting the aggregate control signal as a current-mode output for controlling a local oscillator generating the phase of the local oscillator signal, the local oscillator configured to induce a phase offset into the local oscillator signal in response to the aggregate control signal.

20 Claims, 14 Drawing Sheets

(51) Int. Cl.
  *H03L 7/08*   (2006.01)
  *H03L 7/085*  (2006.01)
  *H03L 7/099*  (2006.01)
  *H04L 7/00*   (2006.01)

(52) U.S. Cl.
  CPC ............ *H03L 7/0807* (2013.01); *H03L 7/099* (2013.01); *H04L 7/0087* (2013.01); *H04L 7/033* (2013.01)

(58) Field of Classification Search
  USPC ........................................................ 375/355
  See application file for complete search history.

(56) References Cited

U.S. PATENT DOCUMENTS

| | | |
|---|---|---|
| 5,528,198 A | 6/1996 | Baba et al. |
| 5,602,884 A | 2/1997 | Wieczorkiewicz et al. |
| 5,629,651 A | 5/1997 | Mizuno |
| 5,802,356 A | 9/1998 | Gaskins et al. |
| 6,026,134 A | 2/2000 | Duffy et al. |
| 6,037,812 A | 3/2000 | Gaudet |
| 6,122,336 A | 9/2000 | Anderson |
| 6,307,906 B1 | 10/2001 | Tanji et al. |
| 6,316,987 B1 | 11/2001 | Dally et al. |
| 6,380,783 B1 | 4/2002 | Chao et al. |
| 6,389,091 B1 | 5/2002 | Yamaguchi et al. |
| 6,426,660 B1 | 7/2002 | Ho et al. |
| 6,507,544 B1 | 1/2003 | Ma et al. |
| 6,509,773 B2 | 1/2003 | Buchwald et al. |
| 6,633,621 B1 | 10/2003 | Bishop et al. |
| 6,717,478 B1 | 4/2004 | Kim et al. |
| 6,838,951 B1 | 1/2005 | Nieri et al. |
| 6,917,762 B2 | 7/2005 | Kim |
| 7,078,978 B2 | 7/2006 | Wakii |
| 7,102,449 B1 | 9/2006 | Mohan |
| 7,199,728 B2 | 4/2007 | Dally et al. |
| 7,336,112 B1 | 2/2008 | Sha et al. |
| 7,532,697 B1 | 5/2009 | Sidiropoulos et al. |
| 7,535,957 B2 | 5/2009 | Ozawa et al. |
| 7,616,075 B2 | 11/2009 | Kushiyama |
| 7,650,525 B1 | 1/2010 | Chang et al. |
| 7,688,929 B2 | 3/2010 | Co |
| 7,822,113 B2 | 10/2010 | Tonietto et al. |
| 7,839,229 B2 | 11/2010 | Nakamura et al. |
| 7,852,109 B1 | 12/2010 | Chan et al. |
| 7,860,190 B2 | 12/2010 | Feller |
| 8,036,300 B2 | 10/2011 | Evans et al. |
| 8,253,454 B2 | 8/2012 | Lin |
| 8,791,735 B1 | 7/2014 | Shibasaki |
| 8,929,496 B2 | 1/2015 | Lee et al. |
| 9,036,764 B1 | 5/2015 | Hossain et al. |
| 9,059,816 B1 | 6/2015 | Simpson et al. |
| 9,306,621 B2 | 4/2016 | Zhang et al. |
| 9,374,250 B1 | 6/2016 | Musah et al. |
| 9,397,868 B1 | 7/2016 | Hossain et al. |
| 9,438,409 B1 | 9/2016 | Liao et al. |
| 9,520,883 B2 | 12/2016 | Shibasaki |
| 9,565,036 B2 | 2/2017 | Zerbe et al. |
| 9,577,815 B1 | 2/2017 | Simpson et al. |
| 9,602,111 B1 | 3/2017 | Shen et al. |
| 9,906,358 B1 | 2/2018 | Tajalli |
| 9,960,902 B1 | 5/2018 | Lin et al. |
| 10,055,372 B2 | 8/2018 | Shokrollahi |
| 10,326,435 B2 | 6/2019 | Arp et al. |
| 2003/0001557 A1 | 1/2003 | Pisipaty |
| 2003/0146783 A1 | 8/2003 | Bandy et al. |
| 2003/0212930 A1 | 11/2003 | Aung et al. |
| 2004/0092240 A1 | 5/2004 | Hayashi |
| 2004/0141567 A1 | 7/2004 | Yang et al. |
| 2005/0024117 A1 | 2/2005 | Kubo et al. |
| 2005/0084050 A1 | 4/2005 | Cheung et al. |
| 2005/0117404 A1 | 6/2005 | Savoj |
| 2005/0128018 A1 | 6/2005 | Meltzer |
| 2005/0141662 A1 | 6/2005 | Sano et al. |
| 2005/0201491 A1 | 9/2005 | Wei |
| 2005/0220182 A1 | 10/2005 | Kuwata |
| 2005/0275470 A1 | 12/2005 | Choi |
| 2006/0062058 A1 | 3/2006 | Lin |
| 2006/0140324 A1 | 6/2006 | Casper et al. |
| 2006/0192598 A1 | 8/2006 | Baird et al. |
| 2006/0232461 A1 | 10/2006 | Felder |
| 2007/0001713 A1 | 1/2007 | Lin |
| 2007/0001723 A1 | 1/2007 | Lin |
| 2007/0047689 A1* | 3/2007 | Menolfi ................. H03L 7/087 375/376 |
| 2007/0086267 A1 | 4/2007 | Kwak |
| 2007/0146088 A1 | 6/2007 | Arai et al. |
| 2007/0147559 A1 | 6/2007 | Lapointe |
| 2007/0183552 A1 | 8/2007 | Sanders et al. |
| 2007/0201597 A1 | 8/2007 | He et al. |
| 2008/0007367 A1 | 1/2008 | Kim |
| 2008/0111634 A1 | 5/2008 | Min |
| 2008/0136479 A1 | 6/2008 | You et al. |
| 2008/0165841 A1 | 7/2008 | Wall et al. |
| 2008/0181289 A1 | 7/2008 | Moll |
| 2008/0219399 A1 | 9/2008 | Nary |
| 2008/0317188 A1 | 12/2008 | Staszewski et al. |
| 2009/0103675 A1 | 4/2009 | Yousefi et al. |
| 2009/0167389 A1 | 7/2009 | Reis |
| 2009/0195281 A1 | 8/2009 | Tamura et al. |
| 2009/0231006 A1 | 9/2009 | Jang et al. |
| 2009/0243679 A1 | 10/2009 | Smith et al. |
| 2009/0262876 A1 | 10/2009 | Arima et al. |
| 2009/0262877 A1 | 10/2009 | Shi et al. |
| 2010/0033259 A1 | 2/2010 | Miyashita |
| 2010/0090723 A1 | 4/2010 | Nedovic et al. |
| 2010/0090735 A1 | 4/2010 | Cho |
| 2010/0156543 A1 | 6/2010 | Dubey |
| 2010/0180143 A1 | 7/2010 | Ware et al. |
| 2010/0220828 A1 | 9/2010 | Fuller et al. |
| 2011/0002181 A1 | 1/2011 | Wang et al. |
| 2011/0025392 A1 | 2/2011 | Wu et al. |
| 2011/0148498 A1 | 6/2011 | Mosalikanti et al. |
| 2011/0234278 A1 | 9/2011 | Seo |
| 2011/0311008 A1 | 12/2011 | Slezak et al. |
| 2012/0051480 A1 | 3/2012 | Usugi et al. |
| 2012/0200364 A1 | 8/2012 | Iizuka et al. |
| 2012/0206177 A1 | 8/2012 | Colinet et al. |
| 2012/0235717 A1 | 9/2012 | Hirai et al. |
| 2012/0327993 A1 | 12/2012 | Palmer |
| 2013/0088274 A1 | 4/2013 | Gu |
| 2013/0091392 A1 | 4/2013 | Valliappan et al. |
| 2013/0093471 A1 | 4/2013 | Cho et al. |
| 2013/0107997 A1 | 5/2013 | Chen |
| 2013/0108001 A1 | 5/2013 | Chang et al. |
| 2013/0207706 A1 | 8/2013 | Yanagisawa |
| 2013/0243127 A1 | 9/2013 | Ito et al. |
| 2013/0271194 A1 | 10/2013 | Madoglio et al. |
| 2013/0285720 A1 | 10/2013 | Jibry |
| 2013/0314142 A1 | 11/2013 | Tamura et al. |
| 2014/0286381 A1 | 9/2014 | Shibasaki |
| 2014/0286457 A1 | 9/2014 | Chaivipas |
| 2015/0043627 A1 | 2/2015 | Kang et al. |
| 2015/0078495 A1 | 3/2015 | Hossain et al. |
| 2015/0117579 A1 | 4/2015 | Shibasaki |
| 2015/0180642 A1 | 6/2015 | Hsieh et al. |
| 2015/0220472 A1 | 8/2015 | Sengoku |
| 2015/0256326 A1 | 9/2015 | Simpson et al. |
| 2016/0056980 A1 | 2/2016 | Wang et al. |
| 2016/0087610 A1 | 3/2016 | Hata |
| 2016/0134267 A1 | 5/2016 | Adachi |
| 2017/0228215 A1 | 8/2017 | Chatwin et al. |
| 2017/0310456 A1 | 10/2017 | Tajalli |
| 2018/0083763 A1 | 3/2018 | Black et al. |
| 2018/0219539 A1 | 8/2018 | Arp et al. |
| 2018/0227114 A1 | 8/2018 | Rahman et al. |
| 2018/0343011 A1 | 11/2018 | Tajalli et al. |
| 2018/0375693 A1 | 12/2018 | Zhou et al. |
| 2019/0109735 A1 | 4/2019 | Norimatsu |
| 2021/0248103 A1 | 8/2021 | Khashaba et al. |

(56) References Cited

OTHER PUBLICATIONS

Loh, Mattew, et al., "A 3x9 GB/s Shared, All-Digital CDR for High-Speed, High-Density I/O", IEEE Journal of Solid-State Circuits, vol. 47, No. 3, Mar. 2012, 641-651 (11 pages).

Riley, M. W., et al., "Cell Broadband Engine Processor: Design and Implementation", IBM Journal of Research and Development, vol. 51, No. 5, Sep. 2007, 545-557 (13 pages).

Chang, Hong-Yeh, et al., "A Low-Jitter Low-Phase-Noise 10-GHz Sub-Harmonically Injection-Locked PLL With Self-Aligned DLL in 65-nm CMOS Technology", IEEE Transactions on Microwave Theory and Techniques, vol. 62, No. 3, Mar. 2014, 543-555 (13 pages).

Nandwana, Romesh Kumar, et al., "A Calibration-Free Fractional-N Ring PLL Using Hybrid Phase/Current-Mode Phase Interpolation Method", IEEE Journal of Solid-State Circuits, vol. 50, No. 4, Apr. 2015, 882-895 (14 pages).

Ng, Herman Jalli, et al., "Low Phase Noise 77-GHz Fractional-N PLL with DLL-based Reference Frequency Multiplier for FMCW Radars", European Microwave Integrated Circuits Conference, Oct. 10-11, 2011, 196-199 (4 pages).

Tajalli, Armin, "Wideband PLL Using Matrix Phase Comparator", Journal of Latex Class Files, vol. 14, No. 8, Aug. 2016, 1-8 (8 pages).

Tan, Han-Yuan, "Design of Noise-Robust Clock and Data Recovery Using an Adaptive-Bandwidth Mixed PLL/DLL", Harvard University Thesis, Nov. 2006, 1-169 (169 pages).

Ha, J.C., et al., "Unified All-Digital Duty-Cycle and phase correction circuit for QDR I/O interface", Electronic Letters, The Institution of Engineering and Technology, vol. 44, No. 22, Oct. 23, 2008, 1300-1301 (2 pages).

Ryu, Kyungho, et al., "Process-Variation-Calibrated Multiphase Delay Locked Loop With a Loop-Enbedded Duty Cycle Corrector", IEEE Transactions on Circuits and Systems, vol. 61, No. 1, Jan. 2014, 1-5 (5 pages).

Wang, Yi-Ming, et al., "Range Unlimited Delay-Interleaving and -Recycling Clock Skew Compensation and Duty-Cycle Correction Circuit", IEEE Transactions on Very Large Scale Integration (VLSI) Systems, vol. 23, No. 5, May 2015, 856-868 (13 pages).

\* cited by examiner

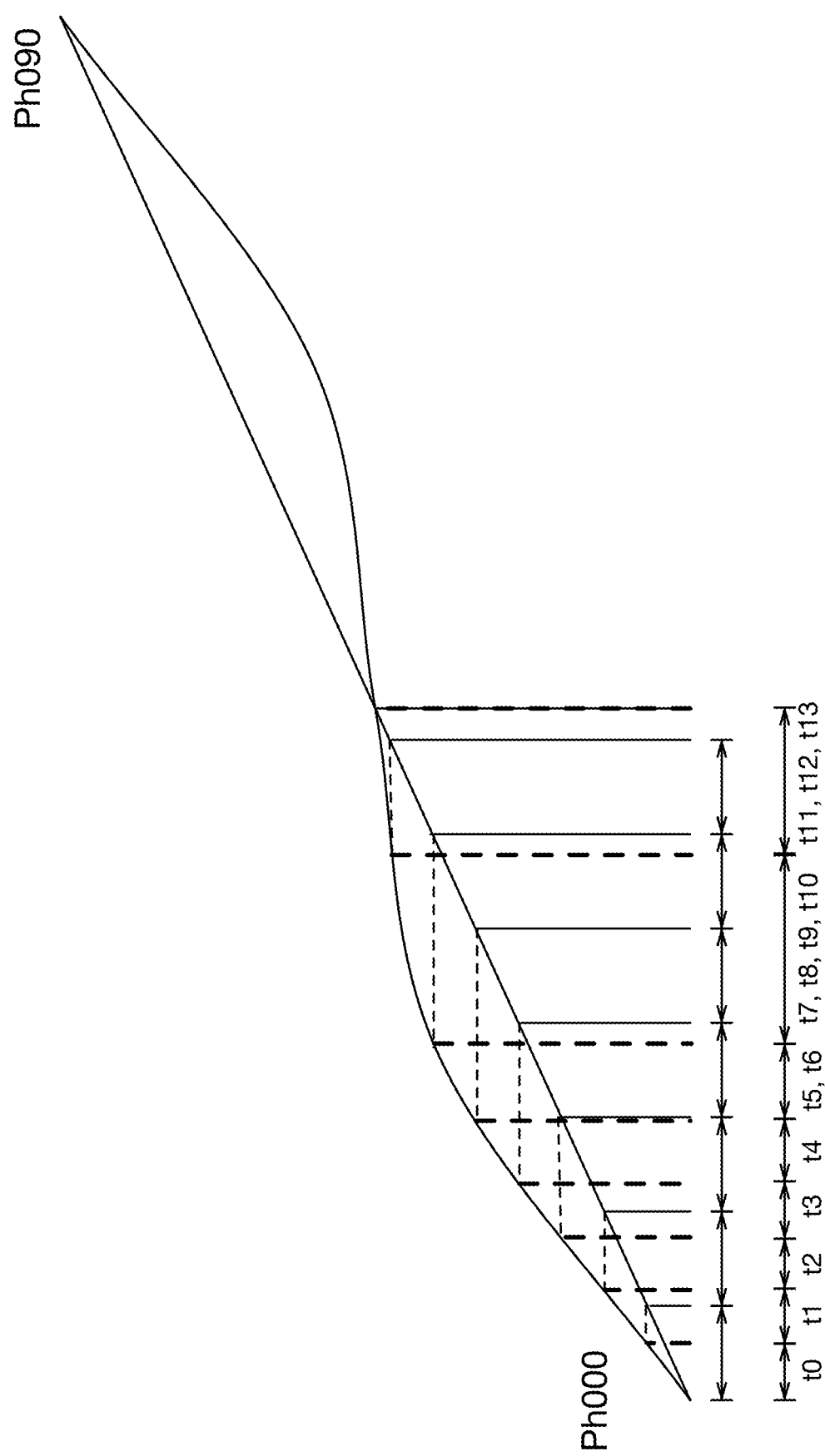

DYNAMICALLY WEIGHTED EXCLUSIVE OR GATE HAVING WEIGHTED OUTPUT SEGMENTS FOR PHASE DETECTION AND PHASE INTERPOLATION

CROSS-REFERENCE TO RELATED APPLICATIONS

This application is a continuation of U.S. application Ser. No. 15/881,509, filed Jan. 26, 2018, entitled "Dynamically Weighted Exclusive OR Gate Having Weighted Output Segments for Phase Detection and Phase Interpolation", naming Armin Tajalli, which is hereby incorporated herein by reference for all purposes.

REFERENCES

The following prior applications are herein incorporated by reference in their entirety for all purposes:

U.S. patent application Ser. No. 15/494,439, filed Apr. 21, 2017, naming Armin Tajalli, entitled "High Performance Phase Locked Loop", hereinafter identified as [Tajalli I].

U.S. patent application Ser. No. 15/602,080, filed May 22, 2017, naming Armin Tajalli, entitled "Data-Driven Phase Detector Element for PLL", hereinafter identified as [Tajalli II].

FIELD OF THE INVENTION

The present embodiments relate to communications systems circuits generally, and more particularly to utilization of a Phase-Locked Loop to obtain a stable, correctly phased receiver clock signal from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device must be sampled (or their signal value otherwise recorded) at intervals best representing the original transmitted values, regardless of transmission channel delays, interference, and noise. This Clock and Data Recovery (CDR) not only must determine the appropriate sample timing, but must continue to do so continuously, providing dynamic compensation for varying signal propagation conditions. Many known CDR systems utilize a Phase-Locked Loop (PLL) or Delay-Locked Loop (DLL) to synthesize a local receive clock having an appropriate frequency and phase for accurate receive data sampling.

BRIEF DESCRIPTION

Methods and systems are described for receiving a reference clock signal and a phase of a local oscillator signal at a dynamically-weighted XOR gate comprising a plurality of logic branches, generating a plurality of weighted segments of a phase-error signal, the plurality of weighted segments comprising (i) positive weighted segments generated by a first subset of the plurality of logic branches when the reference clock signal and the phase of the local oscillator signal have equal logic levels and (ii) negative weighted segments generated by a second subset of the plurality of logic branches when the reference clock signal and the phase of the local oscillator signal have different logic levels, each weighted segment of the phase-error signal having a respective weight applied by a corresponding logic branch of the plurality of logic branches, generating an aggregate control signal based on an aggregation of the weighted segments of the phase-error signal, and outputting the aggregate control signal as a current-mode output for controlling a local oscillator generating the phase of the local oscillator signal, the local oscillator configured to induce a phase offset into the local oscillator signal in response to the aggregate control signal.

To reliably detect the data values transmitted over a communications system, a receiver must accurately measure the received signal value amplitudes at carefully selected times. Various methods are known to facilitate such receive measurements, including reception of one or more dedicated clock signals associated with the transmitted data stream, extraction of clock signals embedded within the transmitted data stream, and synthesis of a local receive clock from known attributes of the communicated data stream.

In general, the receiver embodiments of such timing methods incorporate some form of Clock Data Recovery (CDR), often based on Phase-Lock Loop (PLL) or Delay-Locked Loop (DLL) synthesis of a local receive clock having the desired frequency and phase characteristics. In these embodiments, a Phase Detector compares the relative phase (and in some variations, the relative frequency) of a received reference signal and a local clock signal to produce an error signal, which is subsequently used to correct the phase and/or frequency of the local clock source and thus minimize the error.

[Tajalli I] and [Tajalli II] describe embodiments in which multiple phases or time-offset instances of the received reference clock and/or the local clock are produced and phase compared, allowing additional timing information to be extracted. In such so-called "matrix" phase comparisons, a summation or weighted summation of the multiple phase comparison results is used as the error feedback signal for the PLL. Embodiments described herein combine phase detection functions with adjustable or configurable output weighting, facilitating use in matrix phase comparison.

BRIEF DESCRIPTION OF FIGURES

FIG. 11 illustrates how the transfer characteristics of a phase comparator may be approximated using adjustable time interval weighting.

DETAILED DESCRIPTION

The current state of the art for short-distance wired data communication, such as between integrated circuits on a printed circuit board, exceeds 10 Gbps per wire, for a multiple-wire parallel communications channel. These considerable data rates demand accurate timing control, especially for the timing of the receiver data sampling operation. [Tajalli I] and [Tajalli II] describe generation of such timing clocks using Phase-Locked Loop (PLL) or Delay-Locked Loop (DLL) systems incorporating "matrix" phase comparison operations, in which multiple comparison results between different reference and local clock phases are performed, with the summed result providing a more accurate or informative measure of clock error.

Figure 1:
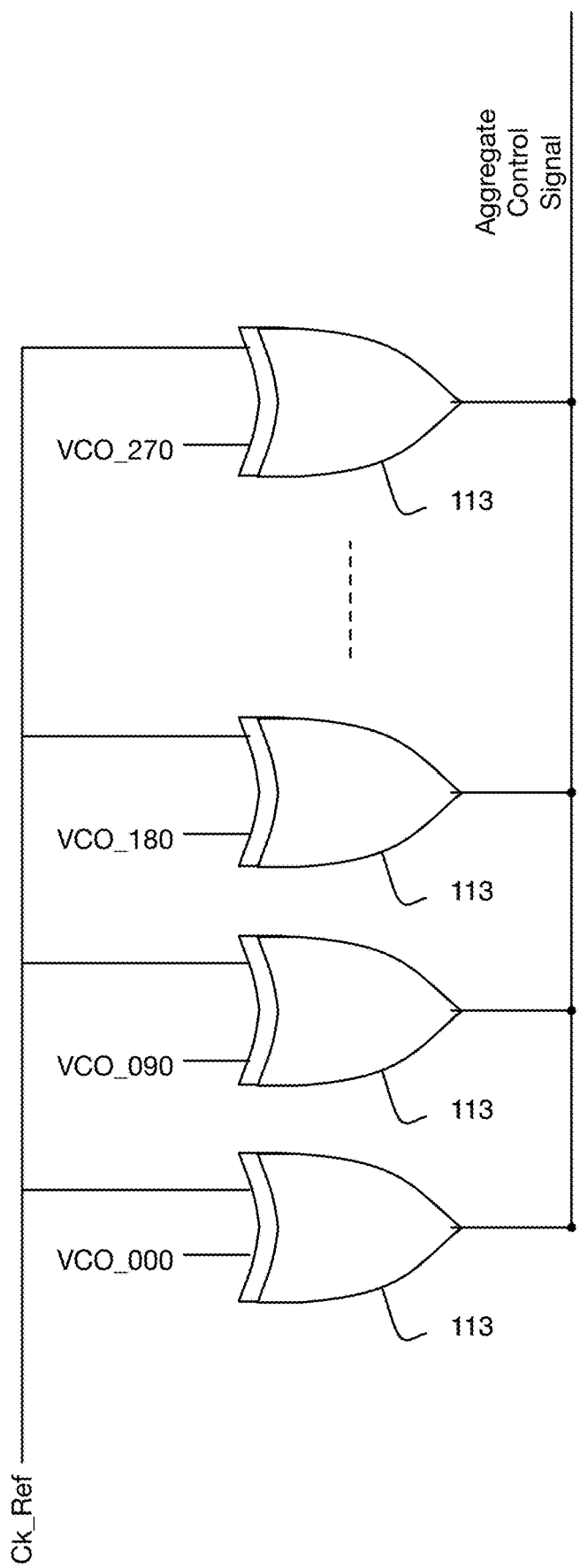
FIG. 1 shows multiple XOR gates functioning as phase comparators between reference clock signal Ck_Ref and phases of the local oscillator signal including phases VCO_000, VCO_090, VCO_180, VCO_270, generating an aggregate control signal.

Numerous forms of phase detectors are known to the art. A simple XOR or XNOR gate may be used to compare, as a non-limiting example, two square wave signals. One familiar with the art will observe that such a digital XOR output will be a variable-duty-cycle waveform which, when low pass filtered into an analog error signal, results in a proportional error signal centered in its analog signal range when the two input signals have a 90-degree phase offset relationship. In FIG. 1, multiple dynamically-weighted XOR phase comparisons are made between reference clock signal Ck_Ref and phases of a local oscillator signal including phases VCO_000, VCO_090, VCO_180, VCO_270, resulting in an aggregate control signal. As taught by [Tajalli I] and [Tajalli II], appropriate adjustment of the weights of the various phase error components may be used to adjust the resulting lock phase of the PLL incorporating the matrix phase comparator, introduce additional poles or zeroes into the closed-loop PLL response, etc.

Figure 3:
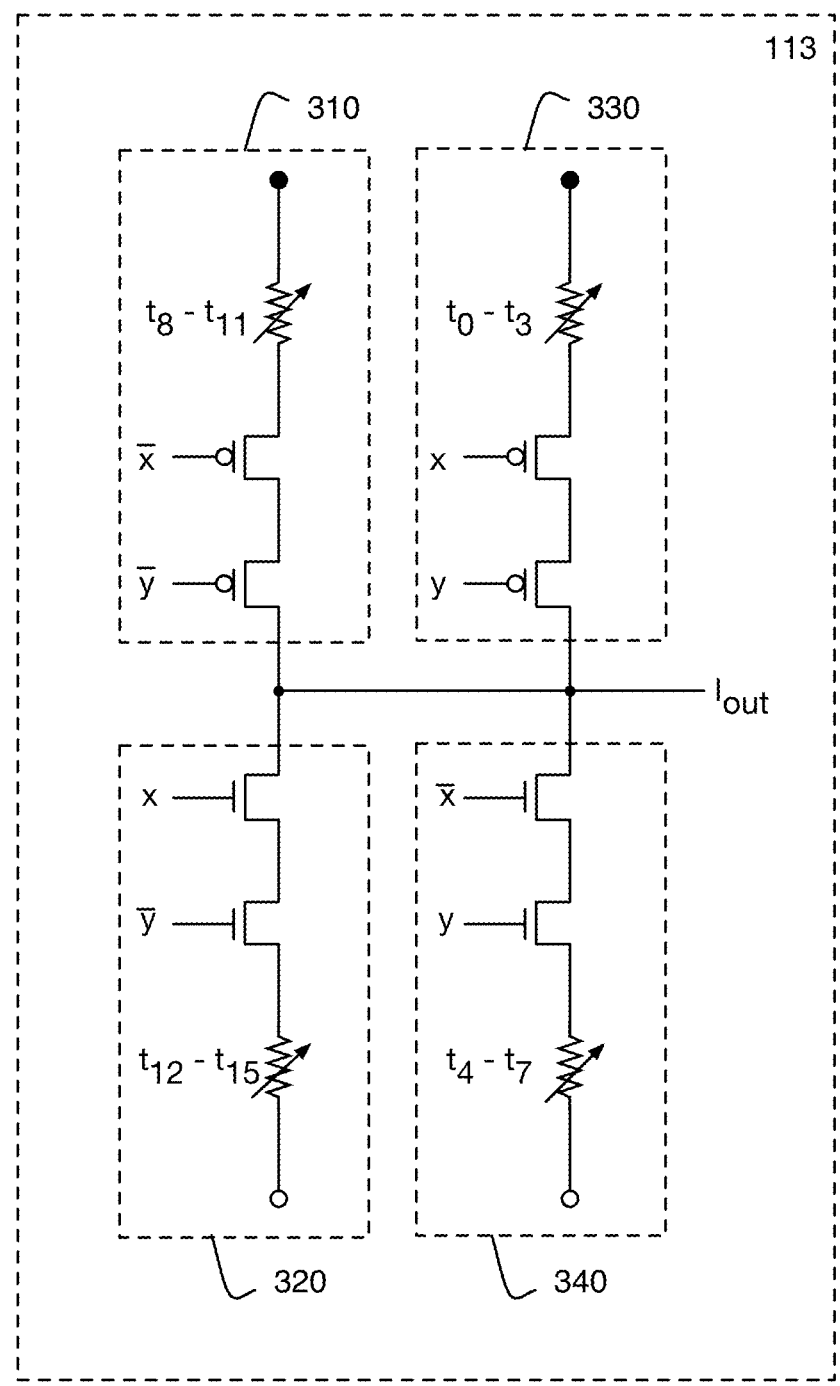
FIG. 3 is a schematic diagram of one embodiment of a dynamically-weighted XOR gate, in which each gate branch is configurable to produce a weighted segment of a phase-error signal.

[Tajalli I] and [Tajalli II] additionally disclose that a digital XOR or XNOR gate may be decomposed into a transistor-level gate including sub-elements representing component AND operations subsequently ORed together to implement the desired composite function. Embodiments are described herein in which each such sub-element may be separately weighted so as to produce a more finely adjustable phase-error signal, that may be further combined with phase-error signals from other dynamically-weighted XOR gates receiving different phases of the local oscillator signal to generate the aggregate control signal, thus providing an interpolation. FIG. 3 is one example of this technique, where XOR gate 113 has been decomposed into individual AND terms 310, 320, 330, 340, each including a resistive weighting element, and all of which are ORed together to produce an aggregate control signal Iout that may be used for controlling phase adjustments in a local oscillator. Following standard practice for CMOS logic, NMOS sub-elements 320 and 340 implement the active-low function components $\overline{\text{Iout}} = (x \cdot \overline{y}) + (\overline{x} \cdot y)$ and PMOS sub-elements 310 and 330 implement the active-high function components $\text{Iout} = (\overline{x} \cdot \overline{y}) + (x \cdot y)$. Thus, the resulting phase-error signal output from gate 113 is composed of both positive-weighted (active-high) and negative-weighted (active-low) segments, allowing both active sourcing and sinking of output current.

Figure 4A:
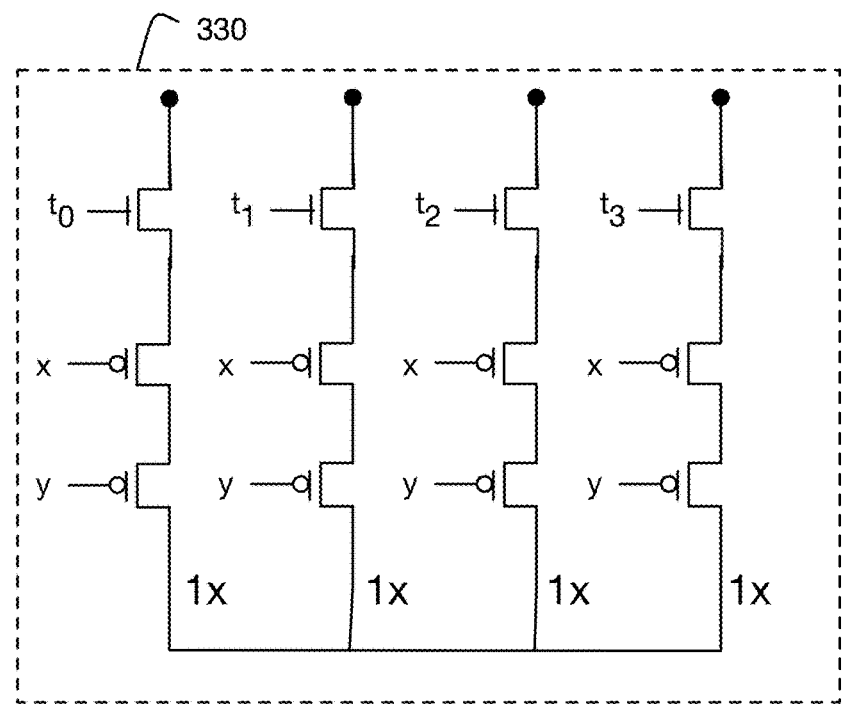
FIGS. 4A and 4B are schematic diagrams of dynamically-weighted XOR gate embodiments incorporating clocked weighting functions.
Figure 4B:
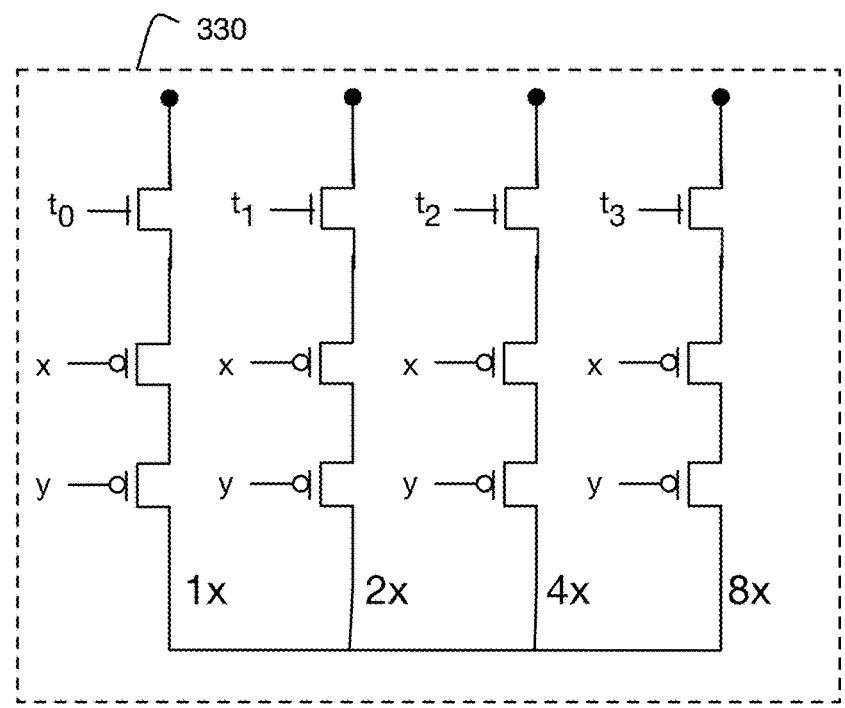

FIGS. 4A and 4B illustrate further embodiments, in which configuration of the weighting operations for a decomposed gate such as that of FIG. 3 is performed by enabling input bits $t_0$, $t_1$, $t_2$, $t_3$, rather than by configurable analog resistances. Specifically, they illustrate two versions of 330 in FIG. 3, with quadrants 310, 320, 340 being implemented in similar fashion. Enabling each of input bits $t_0$, $t_1$, $t_2$, $t_3$ turns on an enabling transistor in one of multiple parallel branch segments or paths, each contributing a fixed amount of current to result K. Thus, the number of such branch segments being enabled controls the overall amplitude, that is, weighting, of the overall result Iout. In a practical embodiment, the amount of current in each path may be controlled by appropriate selection of transistor geometry, as is well known in the art. As two examples offered without implying limitation, FIG. 4A shows transistor geometry chosen such that each parallel path contributes an equal amount of current, while FIG. 4B shows transistor geometry chosen such that current contributions double for consecutive parallel paths. Thus, the embodiment of FIG. 4A might be combined with unary (i.e. counting number) selection of input bits $t_0$, $t_1$, $t_2$, $t_3$ using e.g., a thermometer code, while FIG. 4B may be combined with a binary number representation of input bits $t_0$, $t_1$, $t_2$, $t_3$.

Figure 5:
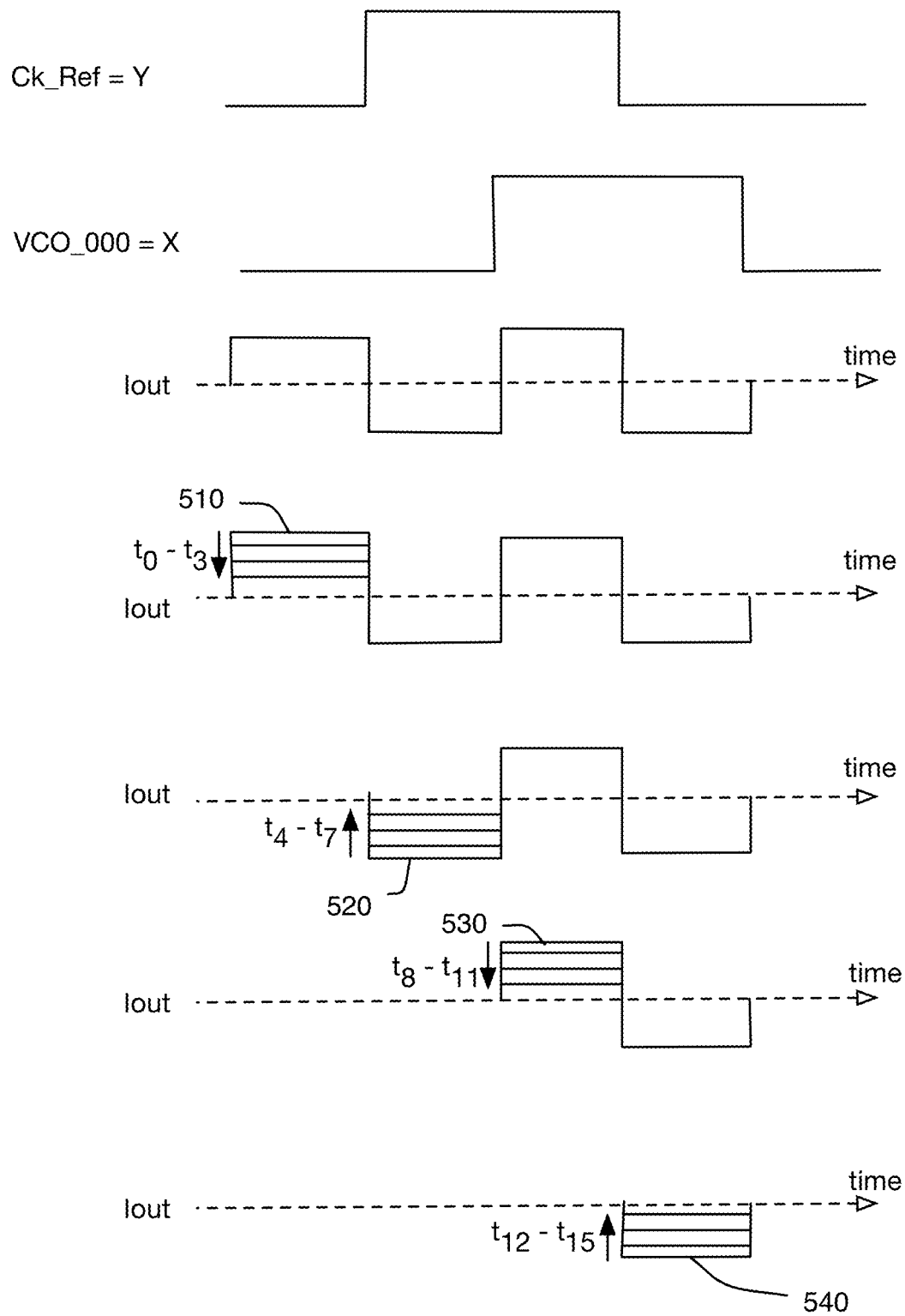
FIG. 5 is a timing diagram illustrating operation of the output weighting function.

FIG. 5 illustrates the results of utilizing the circuit of FIG. 4A in each quadrant of FIG. 3. Enabling one, two, three, or all of $t_0$, $t_1$, $t_2$, $t_3$ in 330 permits weighting of signal amplitude of weighted segment 510. Similar adjustment in 340 allows configuration as shown by weighted segment 520, adjustment of 310 allows configuration as shown by weighted segment 530, and adjustment in 320 allows configuration as shown by weighted segment 540. In this example using four branch segments paths per branch, a total of sixteen possible signal amplitudes may be obtained for the combined output Iout. In some embodiments, additional constraints may be applied, for example to maintain signal symmetry by always enabling equal numbers of PMOS and NMOS (i.e. positive weighted and negative weighted) branch segments.

Figure 2:
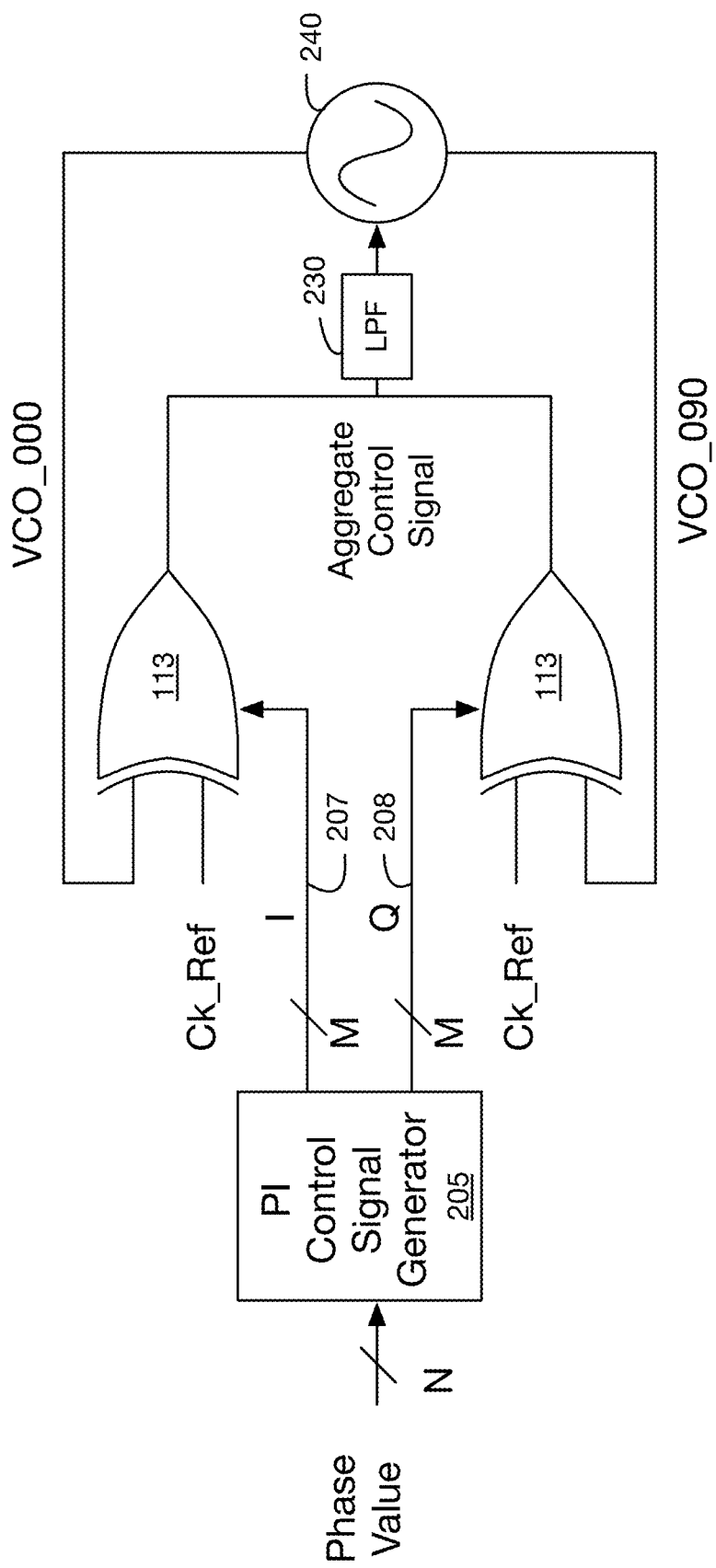
FIG. 2 is a block diagram of one embodiment of a phase control loop comparing phases VCO_000 and VCO_090 of the local oscillator signal to Ck_Ref.

As a further example, intentional control of the number of signal paths being enabled provides the ability to adjust lock phase without introduction of a dedicated phase interpolation device. A matrix phase comparator configuration similar to that of FIG. 1 is assumed, although for descriptive simplicity only two-phase comparison elements 113 will be considered. A simplified block diagram of the resulting PLL configuration is shown in FIG. 2, with the two-phase comparator elements 113 in the first instance comparing phase VCO_000 of the local oscillator signal to Ck_Ref, and in the second instance comparing phase VCO_090 of the local oscillator signal to Ck_Ref. The branch segment weights of each phase comparator are adjusted 207, 208 to produce weighted segments that are subsequently combined and low-pass filtered 230 to generate the aggregate control signal that may be used to control the Voltage-Controlled Oscillator (VCO) 240 producing the phases of the local oscillator signal VCO_000 and VCO_090 to induce a phase offset into the phases of the local oscillator signal.

A Phase Interpolation Control Signal Generator 205 accepts a Phase Value input and produces control signals 207, 208, which, by selectively enabling numbers of branch segments in the first dynamically-weighted XOR gate and in the second dynamically-weighted XOR gate, control the relative contribution of each phase comparator instance to the aggregate control signal that may be low-pass filtered 230 and provided to VCO_240.

Figure 6:
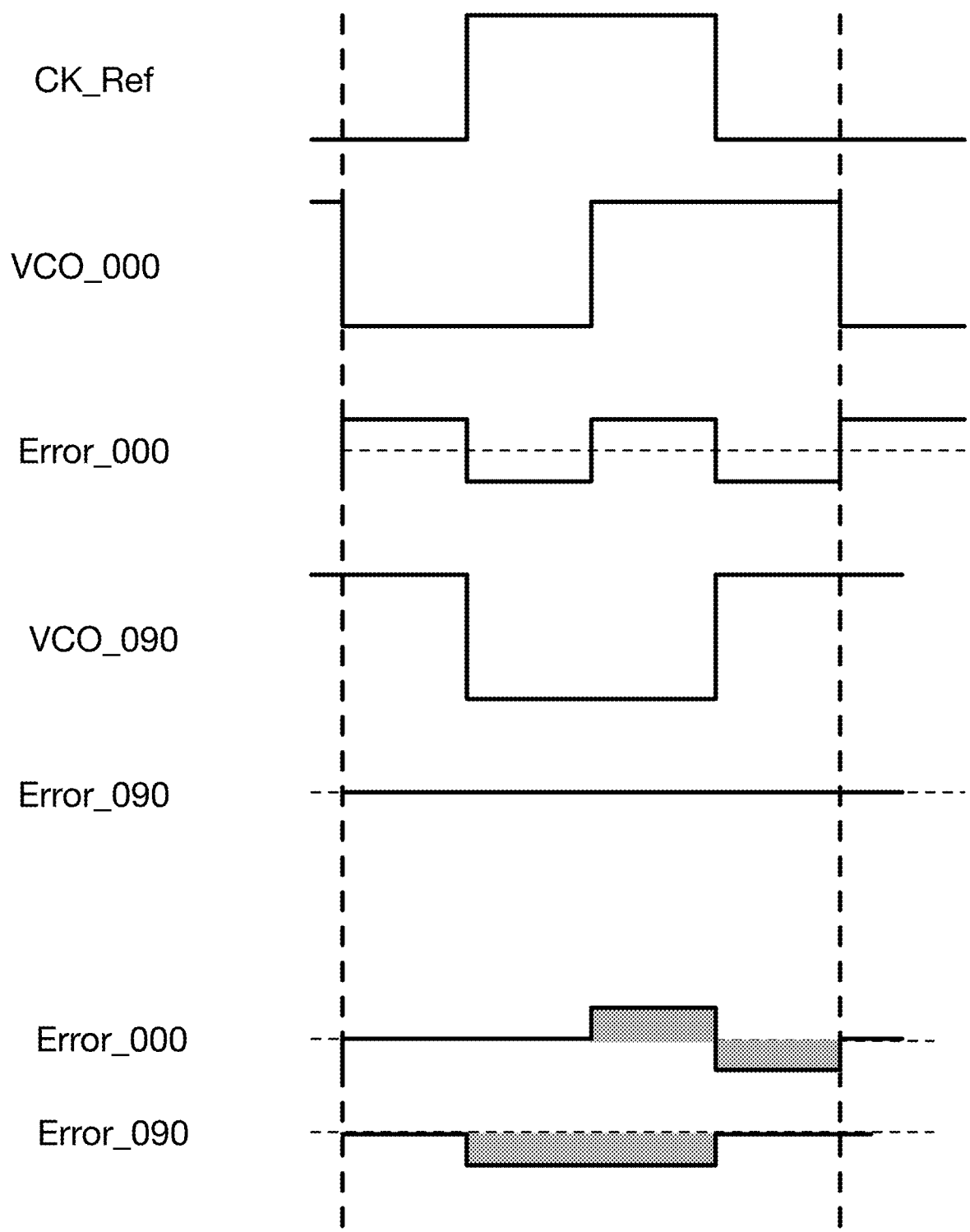
FIGS. 6, 7, 8, 9, and 10 illustrate various aggregate error signals for various reference clock signal-to-local oscillator signal relationships, in accordance with some embodiments.

FIGS. 6-10 are timing diagrams that illustrate formation of aggregate control signals, in accordance with some embodiments. References to FIG. 3 are made in the following descriptions, however it should be noted that similar examples and concepts may be extended to other similar systems. FIG. 6 illustrates a timing diagram of an interpolation between phases VCO_000 and VCO_090 of the local oscillator signal. As shown, FIG. 6 is the state of the weighted segments of phase-error signals error_000 and error_090 immediately after turning branches 330 and 340 off in a circuit as shown in FIG. 3 that is receiving a reference clock signal and phase VCO_000 of the local oscillator signal, and turning branches 330 and 340 on in a circuit as shown in FIG. 3 that is receiving the reference clock signal and phase VCO_090 of the local oscillator signal. As shown, an aggregation of the shaded portions of weighted segments error_000 and error_090 is mostly negative, and thus the local oscillator is rotated to bring the aggregate control signal to an average of zero, indicating locked condition.

Figure 7:
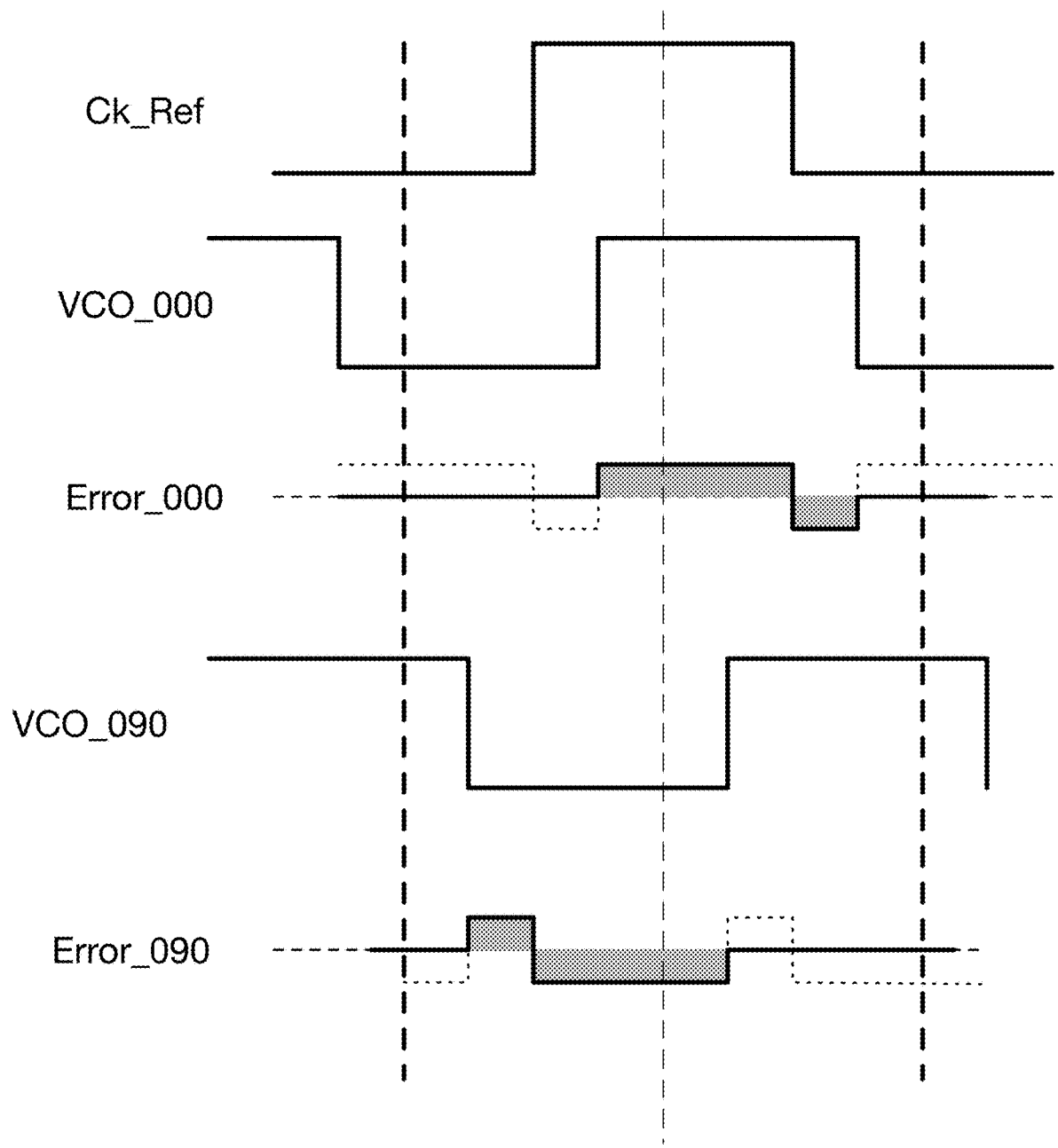

FIG. 7 illustrates the relationship of phases VCO_000 and VCO_090 of the local oscillator signal with respect to the reference clock signal upon reaching lock condition. As shown, phases VCO_000 and VCO_090 have undergone a −45 degree phase shift with respect to the reference clock signal, and a phase of 45 is now locked to the 90-degree lock point of the phase detector. One would expect such a shift, as half of the XOR detector receiving phase VCO_000 is turned on while half of the XOR detector receiving phase VCO_090 is also turned on, and thus both phases are making equal contributions to the aggregate control signal. As will be further noted, the aggregation of weighted segments of phase-error signals error_000 and error_090 thus as an average result of 0, and the VCO is thus in a lock condition in which phases VCO_000 and VCO_090 have undergone a −45 degree phase shift with respect to the 90-degree lock point described above.

Figure 8:
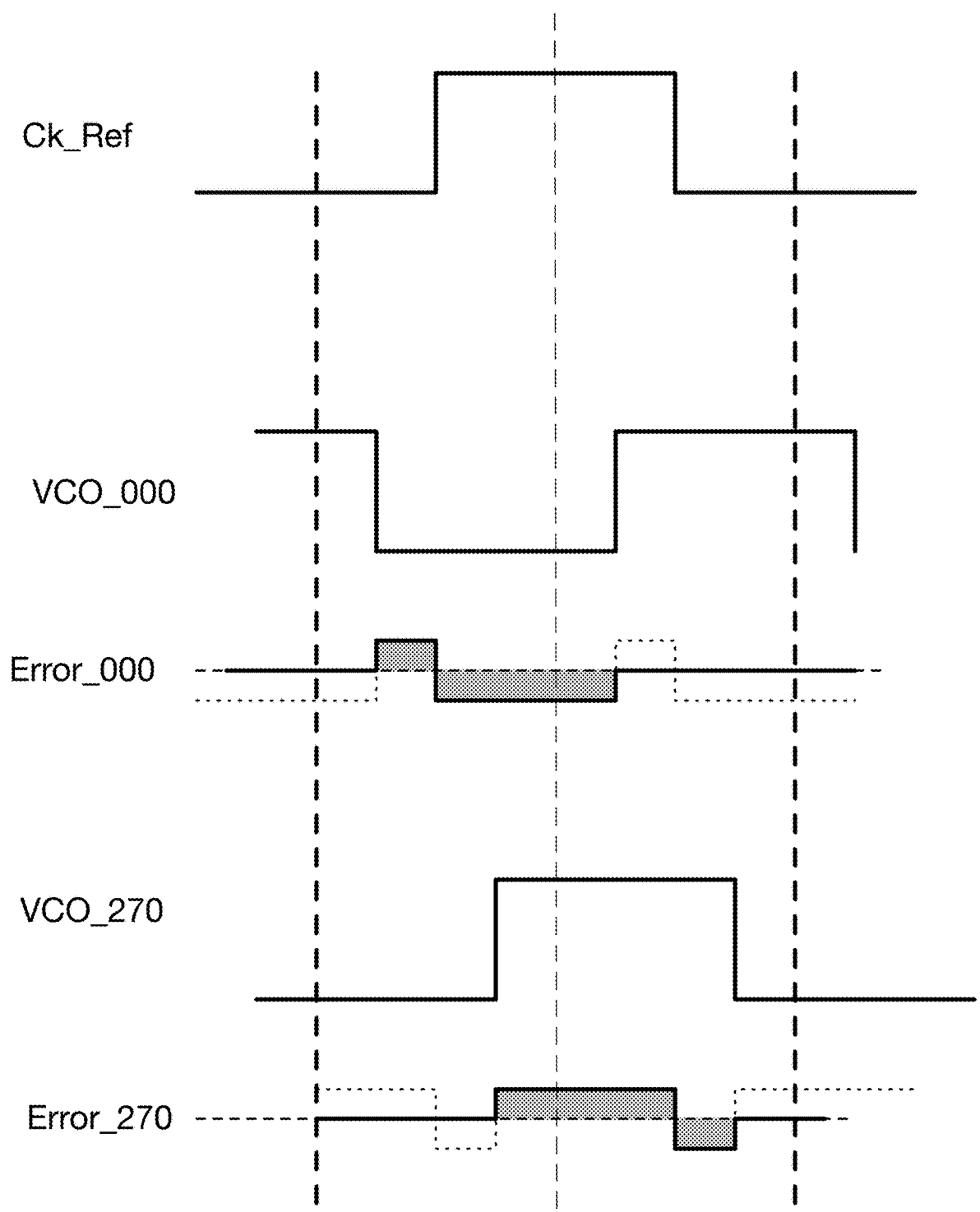

FIG. 8 illustrates a similar scenario, however in FIG. 8, branches 330 and 340 are turned off for phase VCO_000, while branches 330 and 340 are turned on in phase VCO_270. As expected, phases VCO_000 and VCO_270 undergo a +45 degree phase shift with respect to the previous lock point, and thus a phase of 315 degrees is now locked to the 90-degree lock point of the phase detector.

Figure 9:
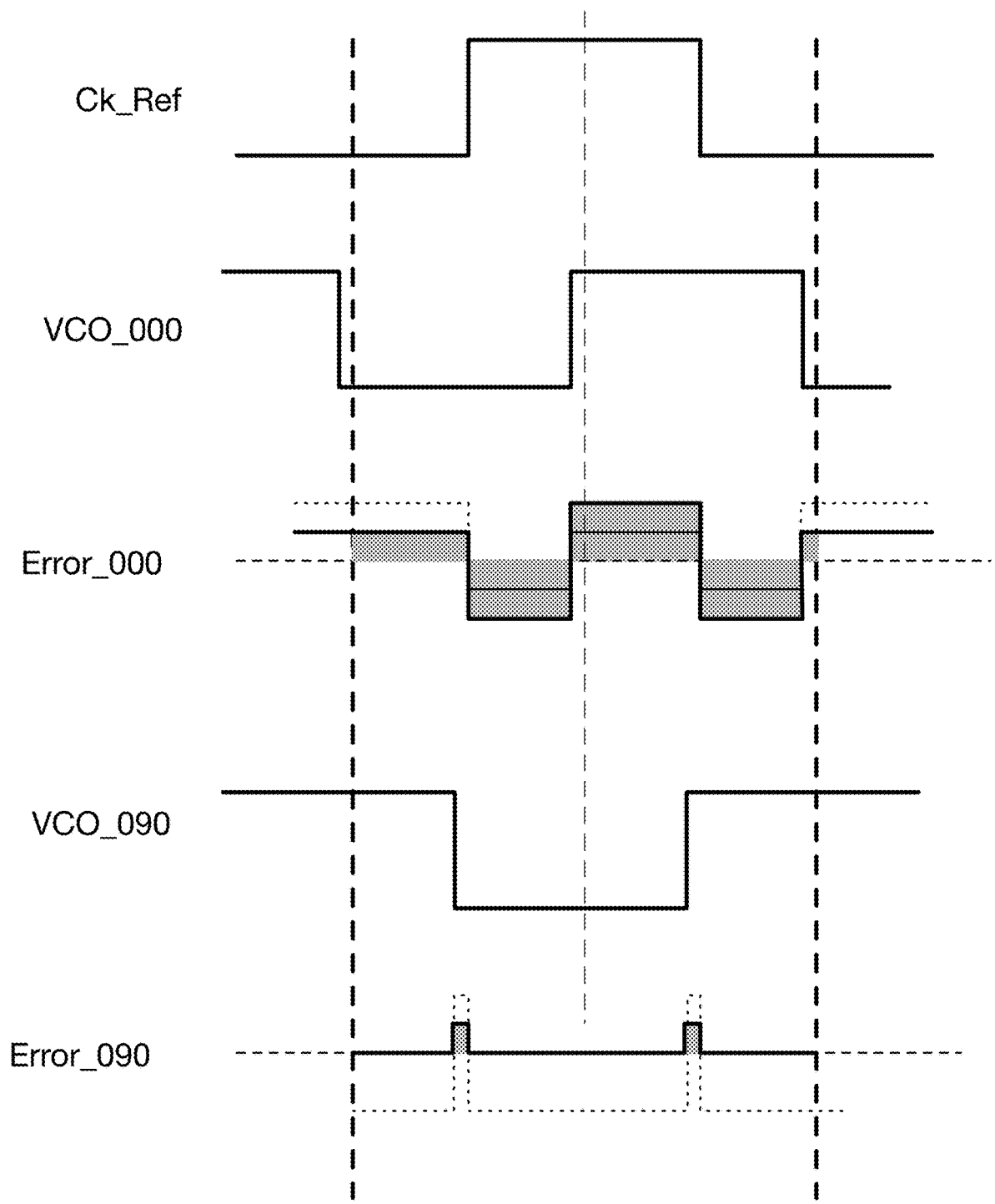

The above examples describe fully turning branches on/off for simplicity of discussion, however, as shown in FIG. 3, a branch may include a plurality of branch segments that may be individually turned off/on in adjacent phases of the local oscillator signal so that such AND operations may partially contribute to more than one phase-error signal. For example, as shown in FIG. 3, t0 and t1 may be turned off/on in the dynamically-weighted XOR gates receiving phases VCO_000/VCO_090, respectively, which only constitutes as one half of branch 330. Such a scenario is illustrated in FIG. 9. In FIG. 9, only t0 and t1 are turned off in the dynamically-weighted XOR receiving phase VCO_000, and only t0 and t1 are turned on in the dynamically-weighted XOR receiving phase VCO_090. As shown, such a configuration introduces a proportionately smaller offset of approximately −11.25 degrees of phase VCO_000 of the local oscillator signal with respect to the 90-degree lock point to the reference clock signal. The weighted segments of phase-error signals error_000 and error_090 are illustrated in FIG. 9. As shown, the weighted segment associated with branch 330 of phase-error signal error_000 has half the amplitude with respect to the rest of the branches, as only two branch segments are contributing to the weighted segment, while all four branch segments contribute to the rest of the weighted segments of phase-error signal error_000.

Figure 10:
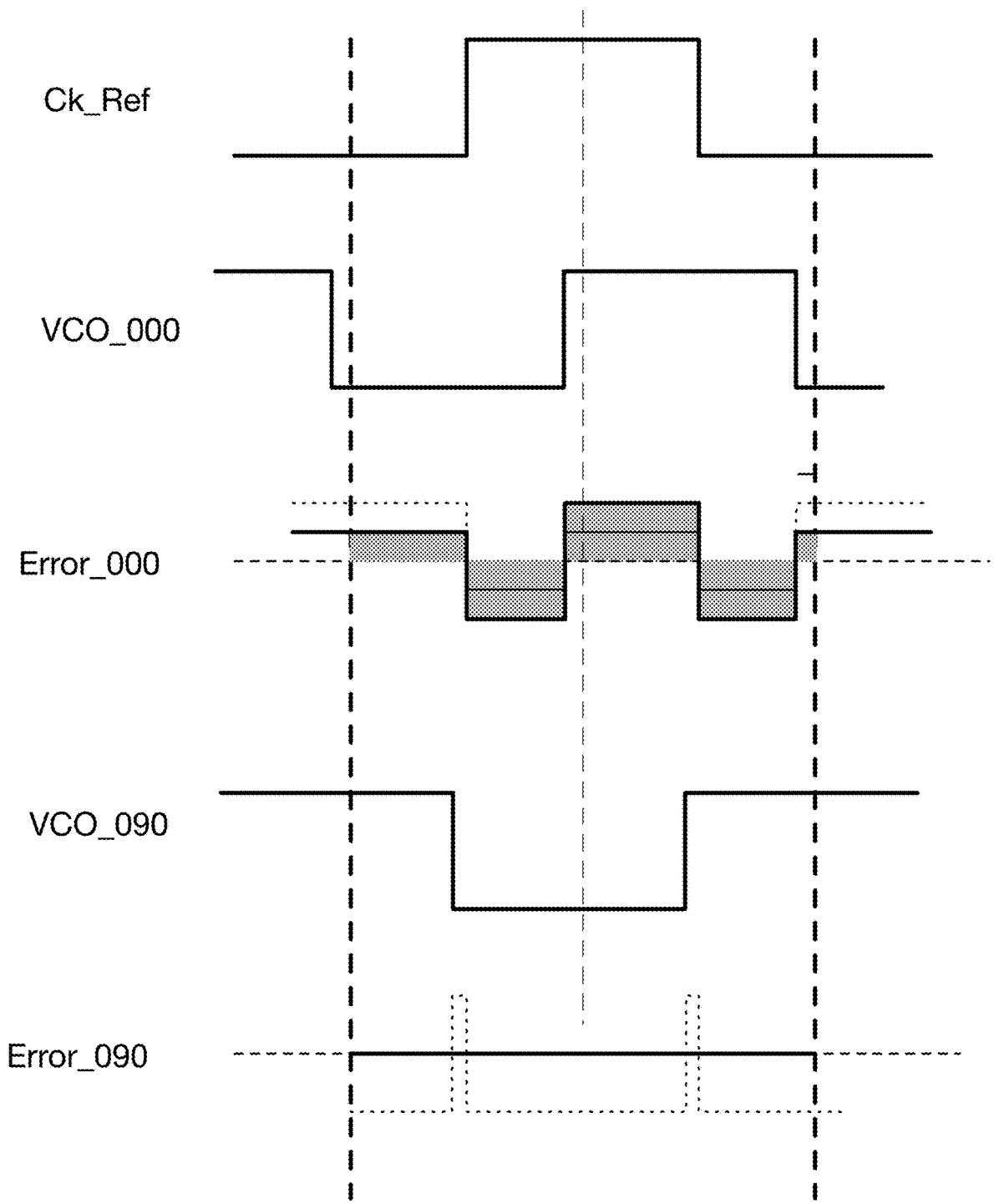

In yet another embodiment, simply turning one or more branch segments off in a branch of a dynamically-weighted XOR gate will induce a phase shift, even without turning the corresponding branch segments on in a dynamically-weighted XOR gate receiving an adjacent phase of the local oscillator signal. Such an embodiment is shown in FIG. 10. In FIG. 1, branch segments t0 and t1 are turned off in the dynamically-weighted XOR gate receiving phase VCO_000 of the local oscillator signal, while no branch segments are turned on in the dynamically-weighted XOR gate receiving phase VCO_090. Such an embodiment induces a phase offset into the phases of the local oscillator signal, as the positive and negative portions of the aggregate control signal adjust their widths, e.g., by rotating the phases of the local oscillator signal to change the duty cycle of the output of the XOR gate, to compensate for the sudden negative aggregate control signal until the total positive area and total negative area are equal, thus indicating locked condition. As one may notice, the phase shift induced by the embodiment shown in FIG. 10 will be larger than that of FIG. 9. In FIG. 9, some of the positive portion of the aggregate control signal is added back in via the positively weighted segment of phase-error signal error_090, while in FIG. 10, there is no contribution from error_090. Thus, a larger shift is induced into the phases of the local oscillator signal to compensate.

FIG. 11 illustrates a desired linear transfer function for the phase interpolation behavior, versus the inherent non-linear result if the two signals were simply mixed by enabling or disabling a fixed number of weighted segments per adjustment step. It may be observed that the non-linear curve produced by using a fixed increment is always "above" the desired linear response, thus linearization requires fewer segments to be enabled per step. In some embodiments, a predetermined sequence of steps may be determined to achieve a more linear phase interpolation relationship, if such a relationship is desired.

Figure 12A:
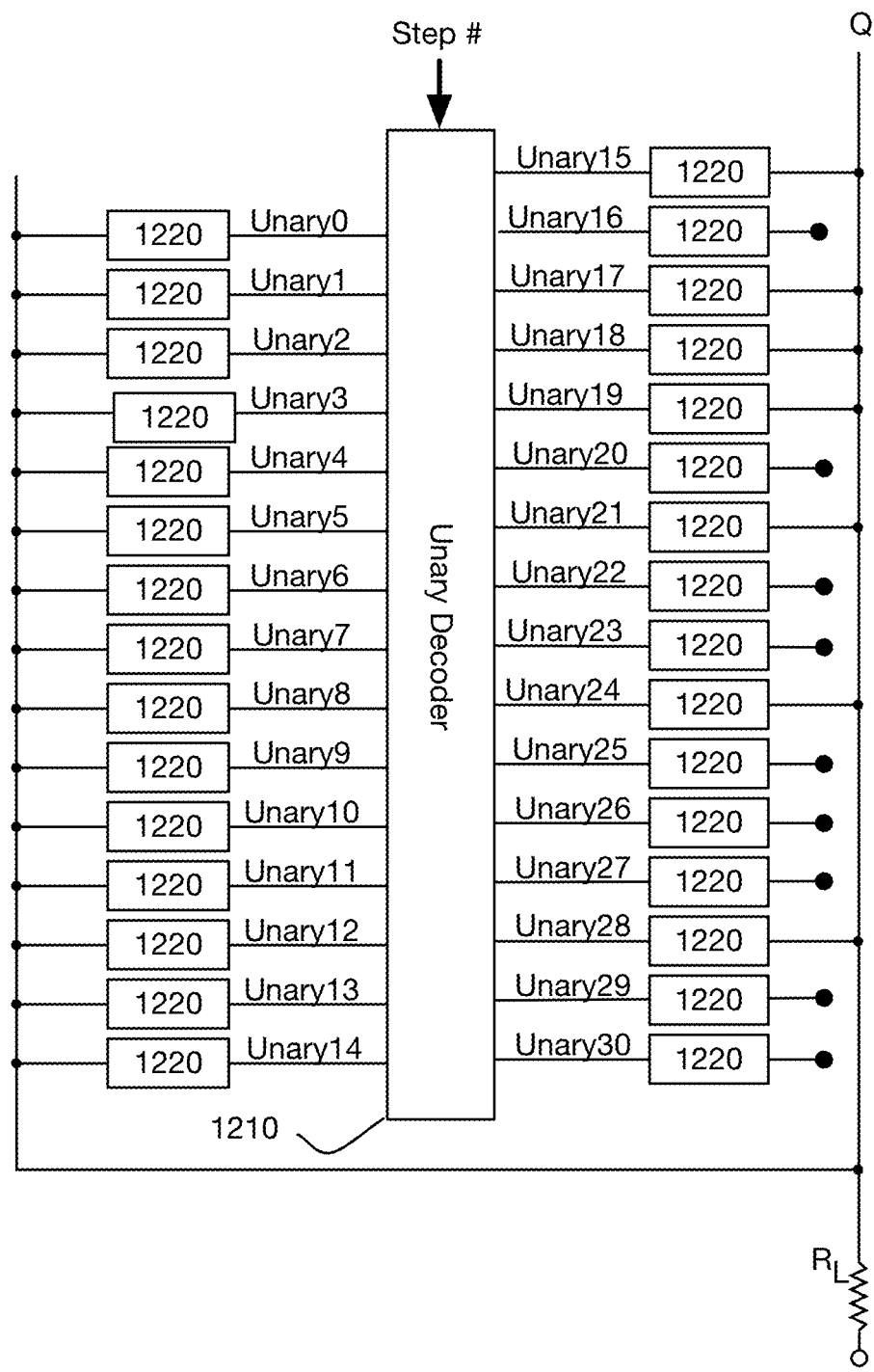
FIGS. 12A and 12B show two embodiments in which a unary selector enables a series of elements to provide a phase-control signal.

FIG. 12A is one such embodiment for closely approximating a linear interpolation operation, by selectively enabling 32 possible gating signals on a first of two phase-error signal outputs. Each instance of element 1220 represents one weighted segment in a circuit sub-element such as that of FIG. 4A, within a first dynamically-weighted XOR gate such as that of FIG. 3. Unary decoder 1210 enables a selected number of its outputs, as determined by input Step #. In such embodiments, each selected output may control a corresponding branch segment in a branch of the plurality of branches of a dynamically-weighted XOR gate. The linearization function is performed by selectively disconnecting certain instances of 1220 from the overall result Q (that is, not connecting that weighted segment to the corresponding branch segment.) Examples of disconnected branch segments include the instances of 1220 enabled by Unary 16, Unary 20, Unary 22-23, Unary 25-27, and Unary 29-30.

Figure 12B:
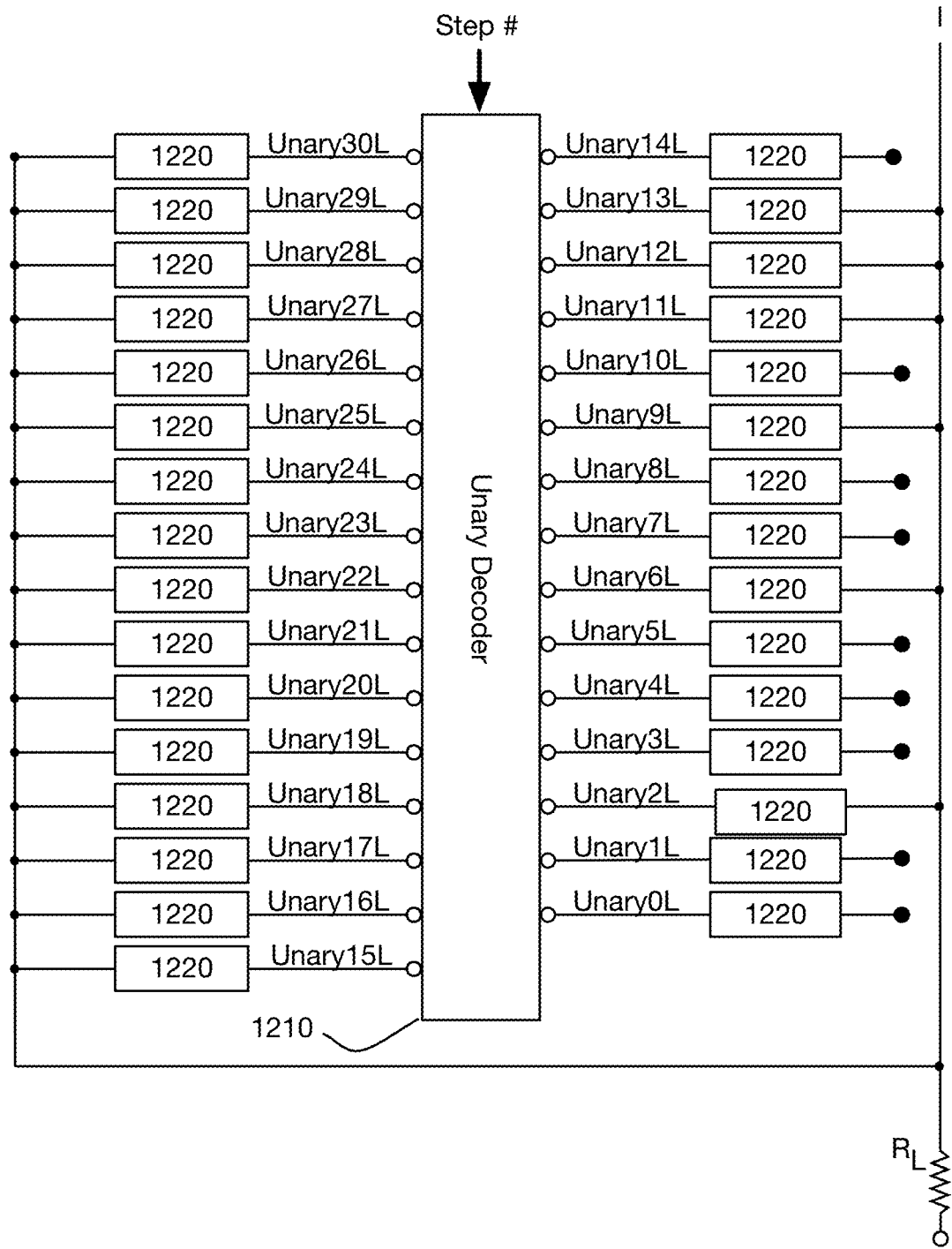

In some embodiments, the number of branch segments enabled to control a first phase-error result and the number of branch segments enabled to control a second phase-error result are coordinated as illustrated by control signal generator 205 of FIG. 2. In at least one embodiment, the number of branch segments in the second phase-error signal are inversely-weighted with respect to branch segments in the first phase-error signal. A complementary embodiment controlling a second dynamically-weighted XOR gate receiving an adjacent phase is shown in FIG. 12B. The outputs I and Q may correspond to phase-control signals 207 and 208, respectively, or vice versa.

Figure 13:
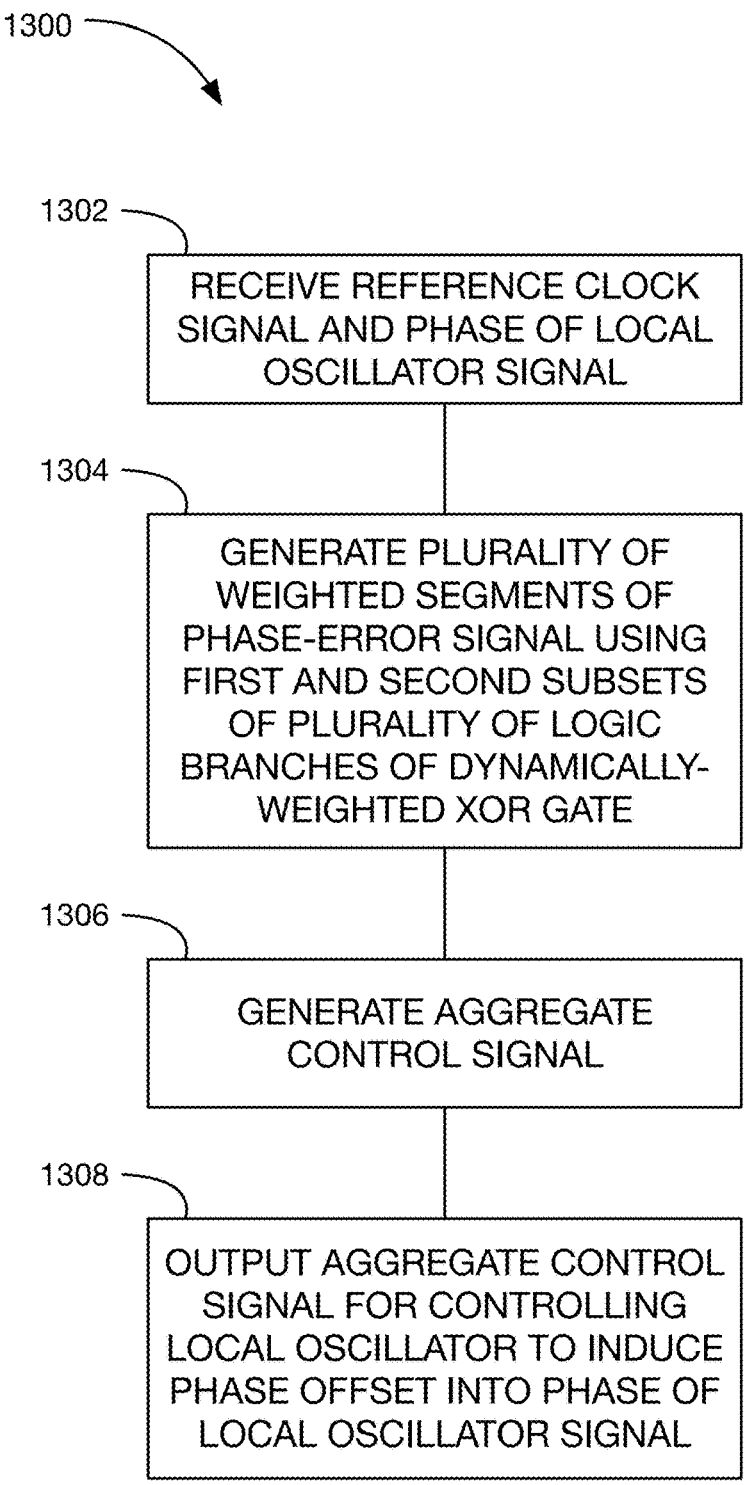
FIG. 13 is a flow chart of a method in accordance with some embodiments.

FIG. 13 is a flow chart of a method in accordance with some embodiments. As shown, method 1300 includes receiving 1302 a reference clock signal and a phase of a local oscillator signal at a dynamically-weighted XOR gate comprising a plurality of logic branches. A plurality of weighted segments of a phase error-signal are generated at 1304, the plurality of weighted segments comprising (i) positive weighted segments generated by a first subset of the plurality of logic branches when the reference clock signal and the phase of the local oscillator signal have equal logic levels and (ii) negative weighted segments generated by a second subset of the plurality of logic branches when the reference clock signal and the phase of the local oscillator signal have different logic levels, each weighted segment of the phase-error signal having a respective weight applied by a corresponding logic branch of the plurality of logic branches. An aggregate control signal is generated 1306 based on an aggregation of the weighted segments of the phase-error signal, and the aggregate control signal is output 1308 as a current-mode output for controlling a local oscillator generating the phase of the local oscillator signal, the local oscillator configured to induce a phase offset into the local oscillator signal in response to the aggregate control signal.

In some embodiments, each logic branch comprises a plurality of branch segments connected in parallel. In such embodiments, the method further includes generating a phase-control signal comprising a plurality of bits. In some embodiments, each branch segment is enabled according to a respective bit of the plurality of bits of the phase-control signal. In some embodiments, each branch segment is enabled according to a corresponding enabling transistor receiving the respective bit as an input. In some embodiments, the respective weight for a given weighted segment is determined by a number of branch segments enabled in the logic branch.

In some embodiments, the respective weight for a given weighted segment is determined in part by transistor dimensions in the logic branch. In alternative embodiments, the respective weight for a given weighted segment is determined in part by a tunable impedance connected to the logic branch.

In some embodiments, the aggregate control signal is further generated based on weighted segments in a second phase-error signal generated using the reference clock signal and a second phase of the local oscillator signal that is adjacent to the phase of the local oscillator signal. In some such embodiments, weighted segments in the second phase-error signal are inversely-weighted with respect to weighted segments in the first phase-error signal. In some embodiments, the induced phase offset corresponds to a non-zero average of the aggregate control signal.

In some embodiments, a method includes receiving a reference clock signal, and first and second phases of a local oscillator signal. Corresponding sets of weighted segments of a first and a second phase-error signal are generated by comparing the reference clock signal to the first and the second phases of the local oscillator signal, respectively, each corresponding set of weighted segments generated by a plurality of logic branches of a respective dynamically-weighted XOR gate, wherein the weighted segments in each of the first and second phase-error signals comprise first and second sets of weights, respectively, the first and second sets of weights selected according to a predetermined phase-offset value. An aggregate control signal is generated based on a summation of the weighted segments of the first and second phase-error signals, and the aggregate control signal is output as a current-mode output for controlling a local oscillator generating the first and second adjacent phases of the local oscillator signal, the local oscillator configured to induce a phase offset into the first and second phases of the local oscillator signal in response to the aggregate control signal by an amount associated with the predetermined phase-offset value.

In some embodiments, the weighted segments in each of the first and second segmented phase-error signals include (i) positive weighted segments generated by a first subset of the plurality of logic branches when the reference clock signal and the corresponding phase of the local oscillator signal have equal logic levels and (ii) negative weighted segments generated by a second subset of the plurality of logic branches when the reference clock signal and the corresponding phase of the local oscillator signal have different logic levels.

In some embodiments, the first and second sets of weights correspond to a total number of logic branch segments enabled in the respective dynamically-weighted XOR gates.

In some embodiments, the first and second sets of weights are selected according to a phase-control signal representing the predetermined phase-offset value of the first and second phases of the local oscillator signal. In some such embodiments, the phase-control signal is generated by a phase-control signal generator. In some embodiments, the phase-control signal generator includes a lookup table and is configured to select a phase-control signal from the lookup table. In some such embodiments, the lookup table may include phase-control signal steps that implement a linear interpolation function. In some embodiments, the phase-control signal may be a thermometer code. In such embodiments, the dynamically-weighted XOR receiving the first phase of the local oscillator signal may receive a thermometer code that is an inverse of a thermometer code received by the dynamically-weighted XOR receiving the second phase of the local oscillator signal.

In some embodiments, the first and second phases of the local oscillator signal have phase differences of 45 degrees. In some embodiments, the first and second phases of the local oscillator signal may have phase differences of 90 degrees or 180 degrees. In some embodiments, the first and second phases of the local oscillator signal may be adjacent phases in that they are pulled from adjacent ring oscillator elements in a local oscillator.

The invention claimed is:

1. A method comprising:
receiving a multi-bit control signal having a value associated with a phase offset between a phase of a reference clock signal and a phase of a local oscillator signal;
generating a sequence of weighted segments on an output node, each weighted segment (i) generated responsive to a respective logical input combination of the phase of the reference clock and the phase of the local oscillator signal at an input at a respective logic branch of a plurality of logic branches and (ii) having a corresponding magnitude determined by a respective portion of bits of the multi-bit control signal provided to the respective logic branch; and
generating a phase control signal by low-pass filtering the sequence of weighted segments on the output node, and responsively providing the phase control signal to a local oscillator generating the phase of the local oscillator signal, the local oscillator adjusting the phase of the local oscillator signal to increase a duration of a first weighted segment to have a longer duration with respect to a second weighted segment, the second weighted segment having a larger magnitude than the first weighted segment.

2. The method of claim 1, wherein each weighted segment corresponds to a summation of a plurality of partial currents generated by the respective logic branch, each partial current generated by a respective branch segment of a plurality of branch segments in the respective logic branch, each branch segment enabled according to a corresponding bit of the portion of bits of the multi-bit control signal.

3. The method of claim 2, wherein each branch segment generates partial currents of equal magnitude, and wherein the respective portion of bits of the multi-bit control signal correspond to a thermometer control code.

4. The method of claim 2, wherein each branch segment generates partial currents of different magnitude, and wherein the respective portion of bits of the multi-bit control signal correspond to a binary control code.

5. The method of claim 2, wherein each branch segment comprises transistors in series receiving the phase of the reference clock signal and the phase of the local oscillator signal, the transistors in series having inverting and non-inverting input configurations defined by the respective logical input combination.

6. The method of claim 1, wherein the plurality of logic branches are connected in an exclusive OR configuration.

7. The method of claim 1, further comprising generating a second sequence of weighted segments and adding the second sequence of weighted segments to the sequence of weighted segments on the output node.

8. The method of claim 7, wherein the second sequence of weighted segments is generated according to logical input combinations between the phase of the reference clock signal and a second phase of the local oscillator signal.

9. The method of claim 7, wherein the second sequence of weighted segments is generated according to logical input combinations between a second phase of the reference clock signal and the phase of the local oscillator signal.

10. The method of claim 1, wherein the first and second weighted segments have opposite polarity magnitudes.

11. An apparatus comprising:
a phase interpolator comprising a plurality of logic branches, the phase interpolator configured to receive a phase of a reference clock signal, a phase of a local oscillator signal, and a multi-bit control signal having a value associated with a phase offset between the phase of the reference clock signal and the phase of a local oscillator signal, the phase interpolator configured to generate a sequence of weighted segments on an output node, each weighted segment (i) generated responsive to a respective logical input combination of the phase of the reference clock and the phase of the local oscillator signal at an input at a respective logic branch of the plurality of logic branches and (ii) having a corresponding magnitude determined by a respective portion of bits of the multi-bit control signal provided to the respective logic branch;
a low pass filter configured to generate a phase control signal by low-pass filtering the sequence of weighted segments on the output node, and responsively providing the phase control signal to a local oscillator generating the phase of the local oscillator signal; and
the local oscillator configured to adjust the phase of the local oscillator signal to increase a duration of a first weighted segment to have a longer duration with respect to a second weighted segment, the second weighted segment having a larger magnitude than the first weighted segment.

12. The apparatus of claim 11, wherein each weighted segment corresponds to a summation of a plurality of partial currents generated by the respective logic branch, wherein each logic branch comprises a respective branch segment of a plurality of branch segments, each branch segment enabled to generate a respective partial current of the plurality of partial currents according to a corresponding bit of the portion of bits of the multi-bit control signal.

13. The apparatus of claim 12, wherein each branch segment is configured to generate partial currents of equal magnitude, and wherein the respective portion of bits of the multi-bit control signal correspond to a thermometer control code.

14. The apparatus of claim 12, wherein each branch segment is configured to generate partial currents of different magnitude, and wherein the respective portion of bits of the multi-bit control signal correspond to a binary control code.

15. The apparatus of claim 12, wherein each branch segment comprises transistors in series receiving the phase of the reference clock signal and the phase of the local oscillator signal, the transistors in series having inverting and non-inverting input configurations defined by the respective logical input combination.

16. The apparatus of claim 11, wherein the plurality of logic branches is connected in an exclusive OR configuration.

17. The apparatus of claim 11, wherein the phase interpolator is further configured to generate a second sequence of weighted segments and to add the second sequence of weighted segments to the sequence of weighted segments on the output node.

18. The apparatus of claim 17, wherein the second sequence of weighted segments is generated by a second plurality of logic branches according to logical input combinations between the phase of the reference clock signal and a second phase of the local oscillator signal.

19. The apparatus of claim 17, wherein the second sequence of weighted segments is generated by a second plurality of logic branches according to logical input combinations between a second phase of the reference clock signal and the phase of the local oscillator signal.

20. The apparatus of claim 11, wherein the first and second weighted segments have opposite polarity magnitudes.

* * * * *